(12) United States Patent
Uno

(10) Patent No.: US 7,414,442 B2
(45) Date of Patent: Aug. 19, 2008

(54) BUFFER CIRCUIT AND INTEGRATED CIRCUIT

(75) Inventor: Osamu Uno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 11/117,383

(22) Filed: Apr. 29, 2005

(65) Prior Publication Data

US 2006/0164134 A1 Jul. 27, 2006

(30) Foreign Application Priority Data

Jan. 24, 2005 (JP) .............................. 2005-015768

(51) Int. Cl.
*H03K 3/00* (2006.01)
(52) U.S. Cl. ............................ 327/112; 326/81; 326/68; 327/333; 323/303
(58) Field of Classification Search .................. 327/112; 326/81, 68
See application file for complete search history.

(56) References Cited

U.S. PATENT DOCUMENTS

| 4,853,560 A * | 8/1989 | Iwamura et al. ................ 326/80 |
| 5,610,544 A | 3/1997 | Aoki |
| 5,886,942 A * | 3/1999 | Akita ..................... 365/230.06 |
| 6,018,252 A | 1/2000 | Imaizumi |
| 6,101,147 A * | 8/2000 | Takahashi et al. ....... 365/230.06 |
| 7,042,245 B2* | 5/2006 | Hidaka ......................... 326/34 |
| 7,098,692 B2* | 8/2006 | Joshi et al. ..................... 326/62 |
| 7,239,198 B1* | 7/2007 | Drapkin et al. ............. 327/563 |
| 2004/0196011 A1 | 10/2004 | Batey |
| 2005/0156653 A1* | 7/2005 | Joshi et al. ................... 327/333 |

FOREIGN PATENT DOCUMENTS

| EP | 2004165993 | 6/2004 |
| EP | 2004356779 | 12/2004 |
| EP | 2004363640 | 12/2004 |
| JP | 07-129538 | 5/1995 |
| JP | 2000-341110 | 12/2000 |
| JP | 2004165993 A * | 6/2004 |

* cited by examiner

*Primary Examiner*—Kenneth B. Wells
*Assistant Examiner*—Ryan C Jager
(74) *Attorney, Agent, or Firm*—Arent Fox LLP

(57) ABSTRACT

In a two-stage inverter circuit including an inverter circuit constituted by first and second FETs and an inverter circuit constituted by two FETs, a source and a gate of a third FET are connected to a first power source and a second power source, respectively. A drain of the third FET is connected to a source of the first FET. A source and a gate of a fourth FET are connected to the first power source and the second power source, respectively. A drain of the fourth FET is connected to a source of a seventh FET. A gate of the seventh FET is connected to the second power source, and a drain of the seventh FET is connected to a back gates of the first, third, fourth, seventh and fifth FETs. The drain of the third FET is connected to the drain of the fourth FET.

16 Claims, 11 Drawing Sheets

POWER SOURCE VD1, VD2

FET221, 222

THROUGH CURRENT

POWER SOURCE VD1,VD2

FET221,222

THROUGH CURRENT

POWER SOURCE VD1, VD2

FET31, 32

VOLTAGE Vb

VOLTAGE Va

POWER SOURCE VD1, VD2

FET31, 32

VOLTAGE Vb

VOLTAGE Va

POWER SOURCE VD1, VD2

FET31, 32

VOLTAGE Vb

VOLTAGE Va

POWER SOURCE VD1, VD2

FET31, 32

VOLTAGE Vb

VOLTAGE Va

BUFFER CIRCUIT AND INTEGRATED CIRCUIT

CROSS-REFERENCE TO RELATED APPLICATIONS

This Nonprovisional application claims priority under 35 U.S.C. §119(a) on Patent Application No. 2005-15768 filed in Japan on Jan. 24, 2005, the entire contents of which are hereby incorporated by reference.

BACKGROUND OF THE INVENTION

1. Field of the Invention

The present invention relates to a buffer circuit equipped with power sources having different voltages and including CMOS inverter circuits as logical gate circuits, or to an integrated circuit equipped with such a buffer circuit.

2. Description of Related Art

Since portable apparatuses, such as portable telephones and notebook-sized personal computers, are generally powered by batteries, such apparatuses are requested to have low power consumption so as to withstand extended use. Hence, each of integrated circuits being used in these apparatuses is divided into blocks for each function. Depending on the usage condition of such an apparatus, power is supplied only to a functional block required for the operation of the apparatus at the time, whereby power saving is attained.

Such an integrated circuit is configured to use power sources having voltages different depending on the function of the integrated circuit to lower the power voltages to the utmost extent and to reduce power consumption. Hence, the integrated circuit is equipped with a buffer circuit for signal interface between circuits that uses power sources having different voltages.

FIG. 1A is a circuit diagram showing the configuration of a conventional buffer circuit (designated by numeral 200). For example, an output signal from a functional block (not shown), operating on a drive voltage VDD1, for attaining a predetermined function inside an integrated circuit 100 is inputted to the buffer circuit 200. On the other hand, the buffer circuit 200 outputs an output signal to another functional block (not shown) operating on a drive voltage VDD2 lower than VDD1. In this case, the buffer circuit 200 has a voltage step-down circuit for stepping down the drive voltage of the integrated circuit 100 from the high voltage VDD1 to the low voltage VDD2. In this kind of buffer circuit 200, the output of an inverter circuit 210 connected to a power source VD1 having the high voltage VDD1 is connected to the input of an inverter circuit 220 connected to a power source VD2 having the low voltage VDD2.

FIG. 1B is a circuit diagram showing the specific circuit configurations of the two inverter circuits 210 and 220 shown in FIG. 1A. The inverter circuit 210 is composed of a P-channel FET 211 whose source is connected to the power source VD1, and an N-channel FET 212 whose source is connected to a drain of the FET 211. A drain of the FET 212 is grounded. Gates of the two FETs 211 and 212 are connected to each other and serve as the input terminal of the inverter circuit 210. Furthermore, a connection node of the drain of the FET 211 and the source of the FET 212 serves as the output terminal of the inverter circuit 210.

Similarly, the inverter circuit 220 is composed of a P-channel FET 221 whose source is connected to the power source VD2, and an N-channel FET 222 whose source is connected to a drain of the FET 221. The drain of the FET 222 is grounded. Gates of the two FETs 221 and 222 are connected to each other and serves as the input terminal of the inverter circuit 220. Furthermore, a connection node of the drain of the FET 221 and the source of the FET 222 serves as the output terminal of the inverter circuit 220.

In the integrated circuit 100 equipped with such buffer circuit 200, the power sources VD1 and VD2 are repeatedly turned ON and OFF depending on the operation state of the integrated circuit 100, for example, in the case that the power source VD1 is turned OFF to stop the operation of the functional block operating on the power source VD1 or in the case that the power source VD2 is turned OFF to stop the operation of the functional block operating on the power source VD2. This reduces the power consumption of the circuit.

Furthermore, Japanese Patent Application Laid-open No. 2000-341110 has proposed a CMOS transistor circuit in which an output of a first inverter circuit powered by a first power source is connected to an input of a second inverter circuit powered by a second power source, characterized in that an output of a third inverter circuit to which the first power source is inputted and which is powered by the second power source is connected to a gate of an N-channel FET, a drain of the N-channel FET is connected to the output of the first inverter circuit, and a source of the N-channel FET is grounded. In this kind of conventional technology, even in the case that the voltage of the first power source is lowered to the ground level, through current flows the second inverter circuit is prevented, whereby power consumption can be reduced.

However, since the power sources are turned ON or OFF depending on the operation state of the functional block inside the integrated circuit in the above-mentioned conventional technology, an unnecessary current is generated in the CMOS inverter circuit when the power sources are turned ON or OFF, thereby causing a problem of increasing power consumption.

FIG. 2A, FIG. 2B and FIG. 2C are time charts showing operation states of the conventional buffer circuit 200 at the time of power-ON. FIG. 2A shows the changes in the voltages of the two power sources VD1 and VD2, FIG. 2B shows the ON/OFF states of the two FETs 221 and 222 of the inverter circuit 220, and FIG. 2C shows the state of through current flowing the two FETs 221 and 222.

In the case that the power source VD1 is turned ON while the power source VD2 (voltage VDD2) is supplied to the buffer circuit 200 shown in FIG. 1, there is a period in which the voltage of the power source VD1 is lower than the voltage of the power source VD2. For example, when the voltage at the input terminal of the inverter circuit 210 is 0V, the FET 211 turns ON, whereby the voltage Va at the input terminal of the inverter circuit 220 becomes equal to the voltage of the power source VD1 and rises as the voltage of the power source VD1 rises.

At time ta, the voltage of the power source VD1 reaches a threshold voltage Vth of the FET 222, and the FET 222 turns ON. Next, at time tb, the voltage of the power source VD1 reaches a voltage obtained by subtracting the threshold voltage Vth of the FET 221 from the voltage VDD2, and the FET 221 turns OFF. Hence, the two FETs 221 and 222 are in the ON state in the period between time ta and time tb, whereby an unnecessary through current flows the two FETs 221 and 222, and the power consumption increases.

FIG. 3A, FIG. 3B and FIG. 3C are time charts showing other operation states of the conventional buffer circuit 200 at the time of power-ON. FIG. 3A shows the changes in the voltages of the two power sources VD1 and VD2, FIG. 3B shows the ON/OFF states of the two FETs 221 and 222 of the inverter circuit 220, and FIG. 3C shows the state of through current flowing the two FETs 221 and 222.

In the case that the power source VD1 (voltage VDD1) and the power source VD2 (voltage VDD2) are turned ON simultaneously and the voltages are supplied to the buffer circuit 200 shown in FIG. 1, since the rising of the voltage of the power source VD2 is faster than the rising of the voltage of the power source VD1, there is a period in which the voltage of the power source VD1 is lower than the voltage of the power source VD2. For example, when the voltage at the input terminal of the inverter circuit 210 is 0V, the FET 211 turns ON, whereby the voltage Va at the input terminal of the inverter circuit 220 becomes equal to the voltage of the power source VD1 and rises as the voltage of the power source VD1 rises.

At time tc, the voltage of the power source VD1 reaches the threshold voltage Vth of the FET 222, and the FET 222 turns ON. Next, at time td, the voltage of the power source VD1 reaches the voltage obtained by subtracting the threshold voltage Vth of the FET 221 from the voltage VDD2, and the FET 221 turns OFF. Hence, both the two FETs 221 and 222 are in the ON state in the period between time tc and time td, whereby an unnecessary through current flows the two FETs 221 and 222, and the power consumption increases.

Furthermore, in the CMOS transistor circuit disclosed in the above-mentioned Japanese Patent Application Laid-open No. 2000-341110, in the case that the voltage of the first power source is lowered to the ground level, the second power source connected to the third inverter circuit is grounded via the third inverter circuit and the N-channel FET both being in the ON state, whereby an extra current may flow when the first power source is turned ON or OFF.

BRIEF SUMMARY OF THE INVENTION

In consideration of the above-mentioned circumstances, it is an object of the present invention to provide a buffer circuit capable of reducing power consumption, wherein when a first power source or a second power source is turned ON or OFF, unnecessary current flow is prevented by switching the power source for a first logical gate circuit to the first power source or the second power source depending on high or low of the voltage of the first power source and the voltage of the second power source. It is another object of the present invention to provide a buffer circuit capable of improving operation speed by providing a P-channel FET and an N-channel FET whose sources, drains and gates are respectively connected to each other. It is still another object of the present invention to provide a buffer circuit capable of stabilizing back gate voltages and to provide an integrated circuit equipped with such a buffer circuit.

A buffer circuit according to a first invention is a buffer circuit comprising: a first power source; a second power source different from the first power source; and a first logical gate circuit including CMOS inverter circuit and a second logical gate circuit; wherein the first logical gate circuit is powered by the first power source, and the second logical gate circuit is powered by the second power source and whose input terminal is connected to an output terminal of the first logical gate circuit; characterized by further comprising a power source switching circuit for switching the power source for the first logical gate circuit to the second power source when the voltage of the first power source is lower than the voltage of the second power source, and to the first power source when the voltage of the first power source is higher than the voltage of the second power source.

A buffer circuit according to a second invention is a buffer circuit in accordance with the first invention, characterized in that the power source switching circuit comprises a first switching element for supplying the voltage of the first power source to the first logical gate circuit and a second switching element for supplying the voltage of the second power source to the first logical gate circuit, and turns ON or OFF the first switching element or the second switching element depending on high or low of the voltage of the first power source and the second power source.

A buffer circuit according to a third invention is a buffer circuit in accordance with the second invention, characterized in that the CMOS inverter circuit including a first FET of a P-channel FET, and a second FET of an N-channel FET whose source and gate are connected to a drain and a gate of the first FET, respectively; the first switching element is a third FET of a P-channel FET whose source is connected to the first power source and whose gate is connected to the second power source; the second switching element is a fourth FET of a P-channel FET whose source is connected to the second power source, whose gate is connected to the first power source and whose drain is connected to a drain of the third FET; and the drain of the fourth switching element is connected to a source of the first FET of the first logical gate circuit.

A buffer circuit according to a fourth invention is a buffer circuit in accordance with the second invention, characterized in that the CMOS inverter circuit including a first FET of a P-channel FET, and a second FET of an N-channel FET whose source and gate are connected to a drain and a gate of the first FET, respectively; the first switching element is a third FET of a P-channel FET whose source is connected to the first power source and whose gate is connected to the second power source; and the second switching element is a fourth FET of a P-channel FET whose source is connected to the second power source and whose drain is connected to the source of the first FET of the first logical gate circuit and a drain of the third FET; the buffer circuit further comprising a fifth FET of a P-channel FET and a sixth FET of an N-channel FET whose respective sources are connected to each other and also connected to the first power source, whose respective drains are connected to each other and also connected to a gate of the fourth FET and whose respective gates are connected to each other and also connected to the second power source.

A buffer circuit according to a fifth invention is a buffer circuit in accordance with the third or fourth invention, characterized by further comprising a seventh FET of a P-channel FET whose source is connected to the respective drains of the third FET and the fourth FET and whose gate is connected to the second power source, wherein a drain and a back gate of the seventh FET are connected to back gates of the first, third, fourth and fifth FETs.

A buffer circuit according to a sixth invention is a buffer circuit in accordance with the third or fourth invention, characterized by further comprising: a seventh FET of a P-channel FET whose source is connected to the respective drains of the third FET and the fourth FET; and an eighth FET of an N-channel FET whose gate and drain are connected to the second power source and whose source is connected to a gate of the seventh FET; wherein a drain and a back gate of the seventh FET are connected to back gates of the first, third, fourth and fifth FETs.

An integrated circuit according to a seventh invention comprises a functional block powered by a first power source and a functional block powered by a second power source different from the first power source, characterized by further comprising the buffer circuit in accordance with any one of the first invention through the sixth invention.

In the buffer circuit according to the first invention, in the case that the voltage of the first power source becomes lower than the voltage of the second power source, the power source switching circuit switches the power source for the first logical gate circuit to the second power source. In the case that the voltage at the input terminal of the first logical gate circuit including the CMOS inverter circuit is 0V, the voltage at the output terminal of the first logical gate circuit becomes equal to the voltage of the second power source. Since the input terminal of the second logical gate circuit is connected to the output terminal of the first logical gate circuit, the voltage at the input terminal of the second logical gate circuit becomes equal to the voltage of the second power source. Hence, no through current is generated in the second logical gate circuit.

In the case that, the voltage of the first power source becomes higher than the voltage of the second power source, the power source switching circuit switches the power source for the first logical gate circuit to the first power source. In the case that the voltage at the input terminal of the first logical gate circuit is 0V, the voltage at the output terminal of the first logical gate circuit becomes equal to the voltage of the first power source. Since the input terminal of the second logical gate circuit is connected to the output terminal of the first logical gate circuit, the voltage at the input terminal of the second logical gate circuit becomes equal to the voltage of the first power source. Since the voltage of the first power source is higher than the voltage of the second power source, no through current is generated in the second logical gate circuit.

In the buffer circuit according to the second invention, in the case that the voltage of the first power source becomes lower than the voltage of the second power source, the first switching element turns OFF, and the second switching element turns ON. Hence, the power source for the first logical gate circuit is switched to the second power source. On the other hand, in the case that the voltage of the first power source becomes higher than the voltage of the second power source, the first switching element turns ON, and the second switching element turns OFF. Hence, the power source for the first logical gate circuit is switched to the first power source.

In the buffer circuit according to the third invention, in the case that the voltage of the first power source becomes lower than the voltage of the second power source, the third FET turns OFF, and the fourth FET turns ON. The second power source becomes the power source for the first logical gate circuit via the source and drain of the fourth FET having been turned ON. In the case that the voltage at the input terminal of the first logical gate circuit is 0V, the first FET of a P-channel FET turns ON, and the voltage at the output terminal of the first logical gate circuit becomes equal to the voltage of the second power source. Since the input terminal of the second logical gate circuit is connected to the output terminal of the first logical gate circuit, the voltage at the input terminal of the second logical gate circuit becomes equal to the voltage of the second power source. Hence, the gate voltage of the P-channel FET of the inverter circuit included in the second logical gate circuit becomes equal to the source voltage thereof, and the FET turns OFF, whereby no through current is generated in the second logical gate circuit.

In the case that the voltage of the first power source is higher than the voltage of the second power source, the third FET turns ON, and the fourth FET turns OFF. The first power source becomes the power source for the first logical gate circuit via the source and drain of the third FET having been turned ON. In the case that the voltage at the input terminal of the first logical gate circuit is 0V, the first FET of a P-channel FET turns ON, and the voltage at the output terminal of the first logical gate circuit becomes equal to the voltage of the first power source. Since the input terminal of the second logical gate circuit is connected to the output terminal of the first logical gate circuit, the voltage at the input terminal of the second logical gate circuit becomes equal to the voltage of the first power source. Hence, since the voltage of the first power source is higher than the voltage of the second power source, the gate voltage of the P-channel FET of the inverter circuit included in the second logical gate circuit becomes higher than the source voltage thereof, and the FET turns OFF, whereby no through current is generated in the second logical gate circuit.

In the buffer circuit according to the fourth invention, in the case that the voltage of the first power source becomes lower than the voltage of the second power source, the fifth FET of a P-channel FET whose gate is connected to the second power source and whose source is connected to the first power source turns OFF. On the other hand, the sixth FET of an N-channel FET whose gate is connected to the second power source and whose source is connected to the first power source is saturated in a range wherein the voltage of the first power source is higher than the voltage obtained by subtracting the threshold voltage of the sixth FET from the voltage of the second power source. Hence, the gate voltage of the fourth FET is the voltage obtained by subtracting the threshold voltage of the sixth FET from the voltage of the second power source. Since the voltage lower than the voltage of the second power source is applied to the gate, the ON operation of the fourth FET is speeded up.

In the case that the voltage of the first power source is higher than the voltage of the second power source, the fifth FET of a P-channel FET whose gate is connected to the second power source and whose source is connected to the first power source turns ON. Hence, the gate voltage of the fourth FET becomes equal to the voltage of the first power source.

In the buffer circuit according to the fifth invention, in the case that the voltage of the first power source becomes lower than the voltage of the second power source, the third FET turns OFF, and the fourth FET turns ON. Since the gate voltage and the source voltage of the seventh FET become equal to the voltage of the second power source, the back gate voltages of the first, third, fourth, fifth and seventh FETs become almost equal to the voltage of the second power source by virtue of the PN forward bias from the source of the seventh FET.

On the other hand, in the case that the voltage of the first power source is higher than the voltage of the second power source, the third FET turns ON, and the fourth FET turns OFF. In addition, since the gate voltage of the seventh FET becomes lower than the source voltage thereof, the seventh FET turns ON. Hence, the drain voltage of the seventh FET becomes equal to the voltage of the first power source. Since the drain of the seventh FET is connected to the back gates of the first, third, fourth, fifth and seventh FETs, the back gate voltages of the first, third, fourth, fifth and seventh FETs become equal to the voltage of the first power source.

In the buffer circuit according to the sixth invention, in the case that the voltage of the first power source becomes lower than the voltage of the second power source, the fifth FET of a P-channel FET whose gate is connected to the second power source and whose source is connected to the first power source turns OFF. On the other hand, the sixth FET of an N-channel FET whose gate is connected to the second power source and whose source is connected to the first power source turns ON, the third FET turns OFF, and the fourth FET turns ON. The eighth FET whose gate and drain are connected to the second power source is saturated. Hence, the gate voltage of the seventh FET becomes the voltage obtained by subtracting the threshold voltage of the eighth FET from the voltage of the second power source. Since the voltage lower than the voltage of the second power source is applied to the gate of the seventh FET, the ON operation of the seventh FET is speeded up.

In the integrated circuit according to the seventh invention, the output signal of the functional block powered by the first power source is used as the input signal of the functional block powered by the second power source via such a buffer circuit as described above.

The first, second and seventh invention comprise the power source switching circuit for switching the power source for the first logical gate circuit to either the first power source or the second power source in accordance with the voltages of the first and second power sources. Hence, even in the case that high or low of the voltage of the first power source and the voltage of the second power source is changed when the first power source or the second power source is turned ON or OFF, unnecessary through current flow is prevented, and power consumption can be reduced. Furthermore, even in the case that the first power source is turned OFF, the second power source is supplied to the first logical gate circuit. Hence, the function of the first logical gate circuit does not stop, and a signal inputted to the first logical gate circuit is outputted to the second logical gate circuit.

The third invention comprises the third FET whose source is connected to the first power source and whose gate is connected to the second power source, and the fourth FET whose source is connected to the second power source and whose gate is connected to the first power source. Hence, even in the case that high or low of the voltage of the first power source and the voltage of the second power source is changed when the first power source or the second power source is turned ON or OFF, unnecessary through current flow is prevented, and power consumption can be reduced.

The fourth invention comprises the third FET whose source is connected to the first power source and whose gate is connected to the second power source, the fourth FET whose source is connected to the second power source, and the fifth FET of a P-channel FET and the sixth FET of an N-channel FET whose sources, drains and gates are respectively connected to each other. Hence, the ON operation of the fourth FET can be speeded up.

The fifth invention comprises the seventh FET whose gate is connected to the second power source and whose source is connected to the respective drains of the third FET and the fourth FET. Hence, even in the case that switching is carried out between the first power source and the second power source, the back gate voltages of the first, third, fourth, fifth and seventh FETs can be stabilized.

The sixth invention comprises the eighth FET of an N-channel FET whose gate and drain are connected to the second power source, and the seventh FET whose gate is connected to the source of the eighth FET. Hence, the ON operation of the seventh FET can be speeded up.

The above and further objects and features of the invention will more fully be apparent from the following detailed description with accompanying drawings.

BRIEF DESCRIPTION OF THE SEVERAL VIEWS OF THE DRAWINGS

FIG. 2A, FIG. 2B and FIG. 2C are time charts showing operation states of the conventional buffer circuit at the time of power-ON;

FIG. 3A, FIG. 3B and FIG. 3C are time charts showing other operation states of the conventional buffer circuit at the time of power-ON;

FIG. 6A, FIG. 6B, FIG. 6C and FIG. 6D are time charts showing operation states of the buffer circuit according to the present invention at the time of power-ON;

FIG. 8A, FIG. 8B, FIG. 8C and FIG. 8D are time charts showing other operation states of the buffer circuit according to the present invention at the time of power-ON;

DETAILED DESCRIPTION OF THE PREFERRED EMBODIMENTS

Embodiment 1

Figure 1A:
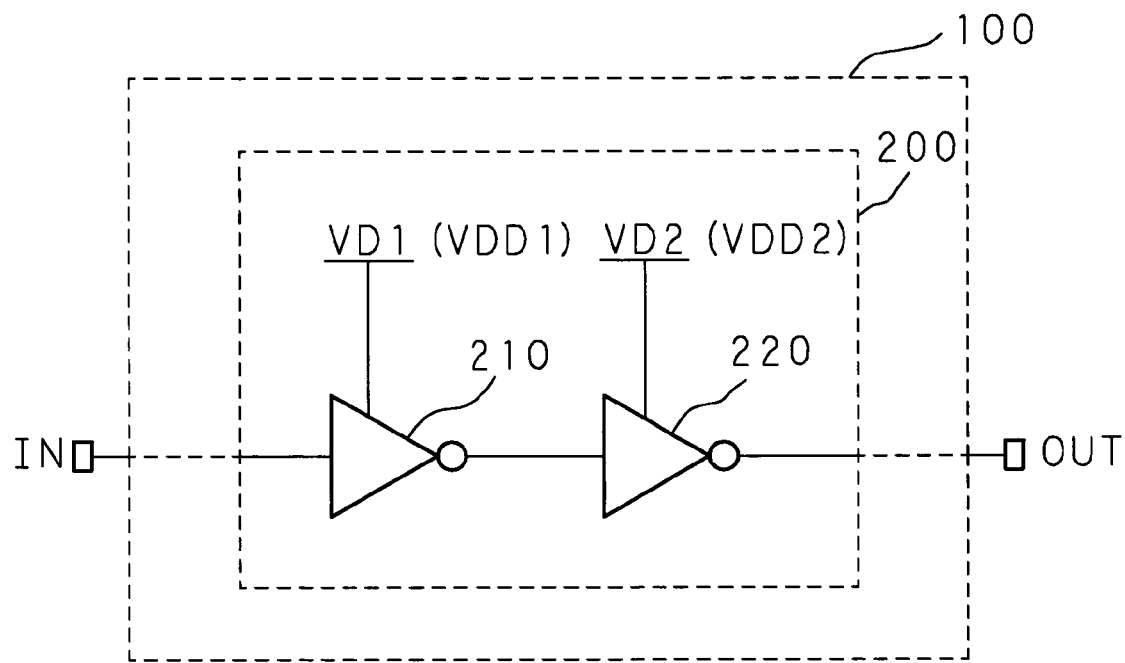
FIG. 1A is a circuit diagram showing the configuration of the conventional buffer circuit.
Figure 1B:
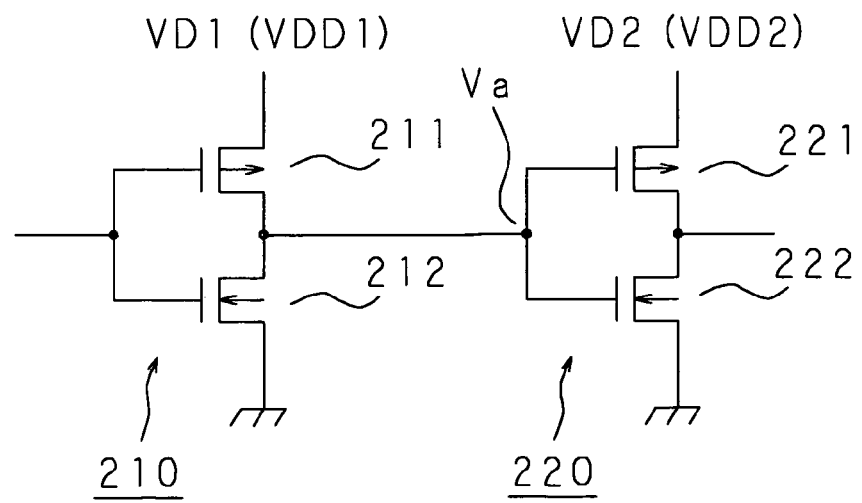
FIG. 1B is a circuit diagram showing the specific circuit configurations of the two inverter circuits shown in FIG. 1A.
Figure 2A:
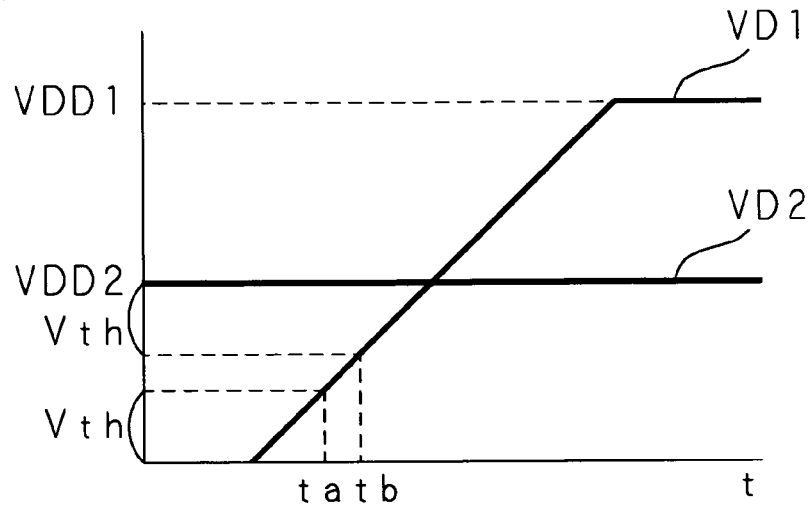
Figure 2B:
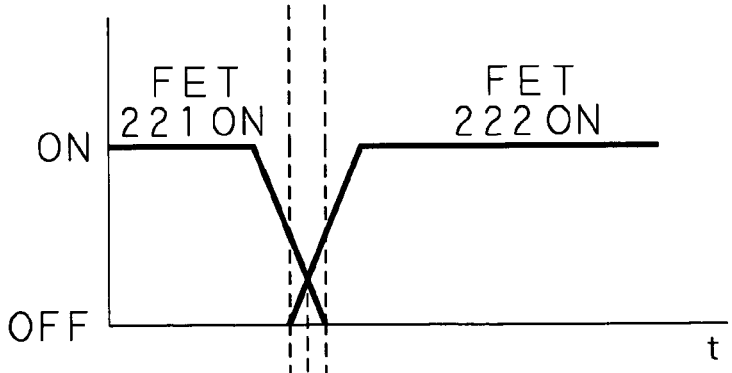
Figure 2C:
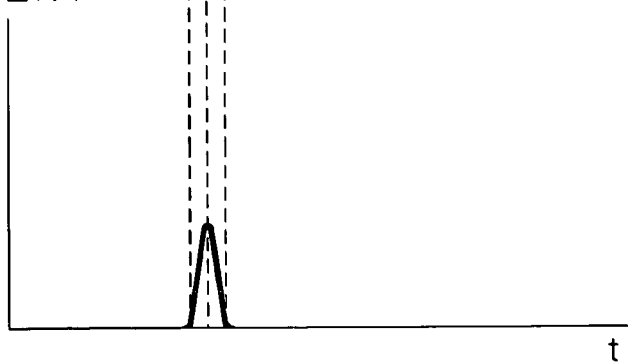
Figure 3A:
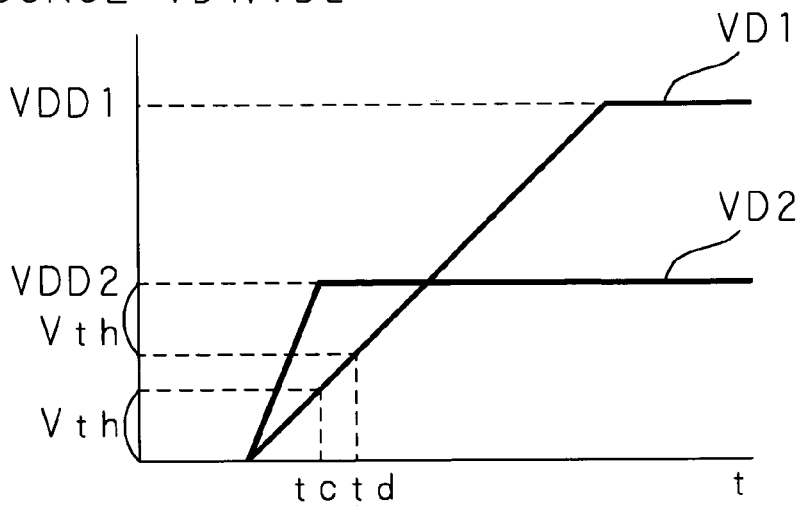
Figure 3B:
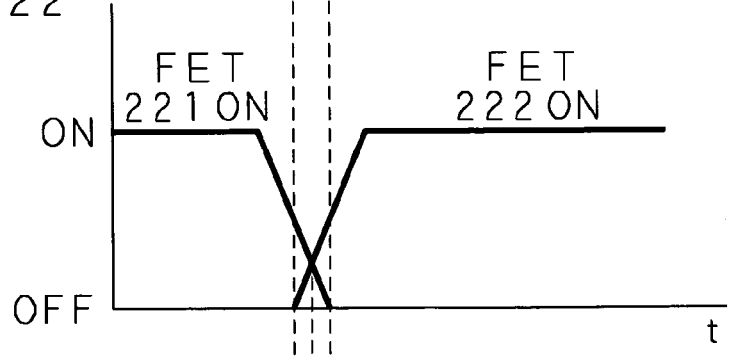
Figure 3C:
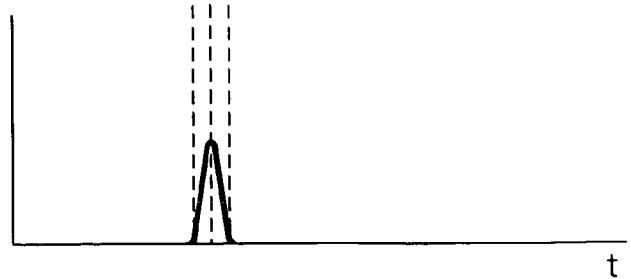
Figure 4:
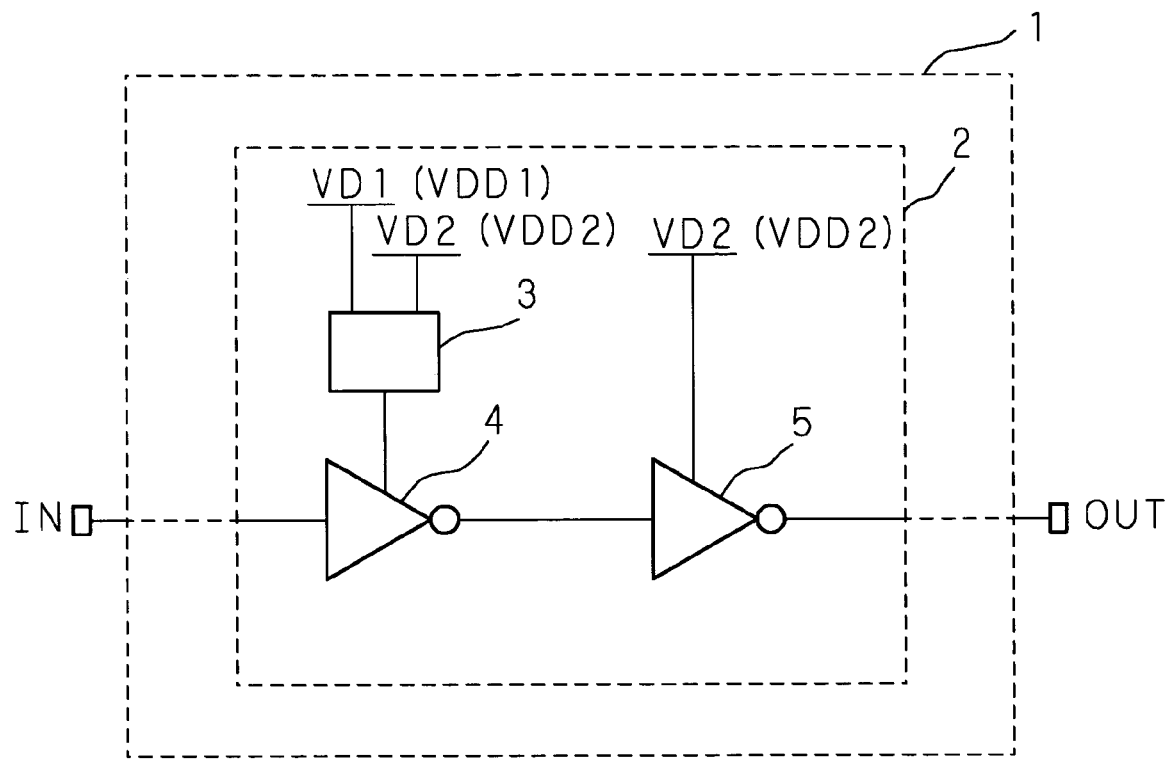
FIG. 4 is a block diagram showing the configuration of a buffer circuit according to the present invention.

The present invention will be described below on the basis of the drawings showing the embodiments thereof. FIG. 4 is a block diagram showing the configuration of a buffer circuit (designated by numeral 2) according to the present invention. An output signal from a functional block (not shown), operating on a drive voltage VDD1, for attaining a predetermined function inside an integrated circuit 1 is inputted to the buffer circuit 2. On the other hand, the buffer circuit 2 outputs an output signal to another functional block (not shown) operating on a drive voltage VDD2 lower than VDD1. In this case, the buffer circuit 2 steps down the drive voltage of the integrated circuit 1 from the high voltage VDD1 to the low voltage VDD2.

The buffer circuit 2 has CMOS inverter circuits 4 and 5 as logical gate circuits and a power source switching circuit 3. A power source VD1 having the voltage VDD1 and a power source VD2 having the voltage VDD2 lower than the voltage VDD1 are connected to the power source switching circuit 3. The power source switching circuit 3 carries out switching so that either the power source VD1 or the power source VD2 is connected to the inverter circuit 4. An output of the inverter circuit 4 is connected to an input of the inverter circuit 5. The power source VD2 is connected to the inverter circuit 5.

Figure 5:
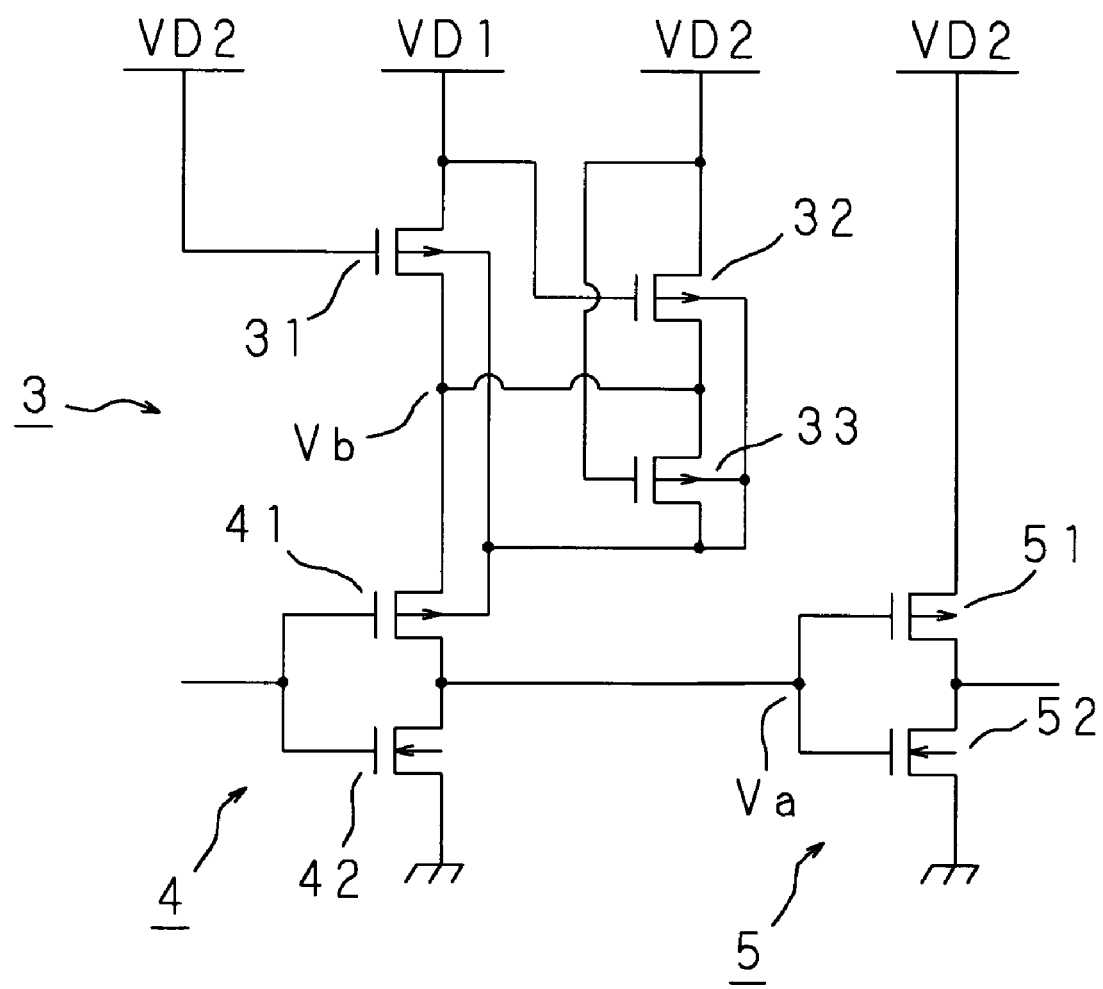
FIG. 5 is a circuit diagram showing the specific circuit configurations of two inverter circuits and a power source switching circuit constituting the buffer circuit according to the present invention.

FIG. 5 is a circuit diagram showing the specific circuit configurations of the inverter circuits 4 and 5 and the power source switching circuit 3 constituting the buffer circuit 2. The inverter circuit 4 is composed of a P-channel FET 41 and an N-channel FET 42. Gates of the two FETs 41 and 42 are connected to each other, and the connection node thereof serves as an input terminal of the inverter circuit 4. A drain of the FET 41 is connected to a drain of the FET 42, and a connection node thereof serves as an output terminal of the inverter circuit 4. A source of the FET 42 is grounded. A source of the FET 41 is connected to the power source switching circuit 3.

The power source switching circuit 3 is composed of P-channel FETs 31, 32 and 33. A source and a gate of the FET 31 are connected to the power source VD1 and the power source VD2, respectively. A drain of the FET 31 is connected to the source of the FET 41. A source and a gate of the FET 32 are connected to the power source VD2 and the power source VD1, respectively. A drain of the FET 32 is connected to a source of the FET 33. A gate of the FET 33 is connected to the power source VD2. A drain of the FET 33 is connected to back gates of the FETs 31, 32, 33 and 41. The connection node of the drain of the FET 31 and a source of the FET 41 is connected to a connection node of the drain of the FET 32 and the source of the FET 33.

The output terminal of the inverter circuit 4 is connected to an input terminal of the inverter circuit 5. The inverter circuit 5 is composed of a P-channel FET 51 and an N-channel FET 52. Gates of the FETs 51 and 52 are connected to each other, and the connection node thereof serves as the input terminal of the inverter circuit 5. A source of the FET 51 is connected to the power source VD2. A drain of the FET 51 is connected to a drain of the FET 52, and the connection node thereof serves as an output terminal of the inverter circuit 5. A source of the FET 52 is grounded.

Figure 6A:
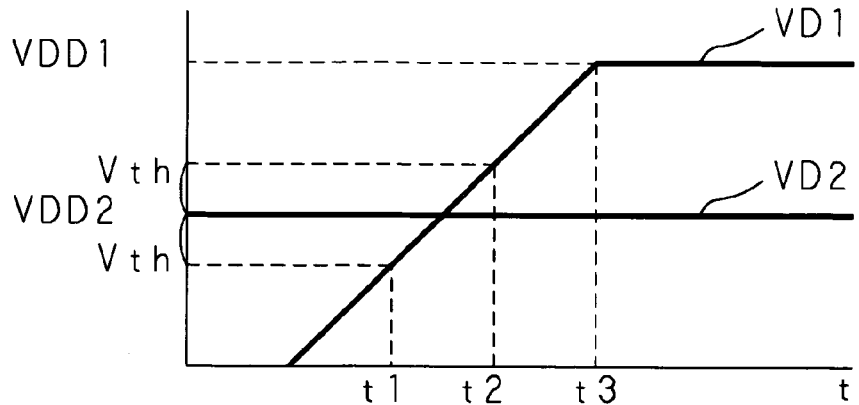
Figure 6B:
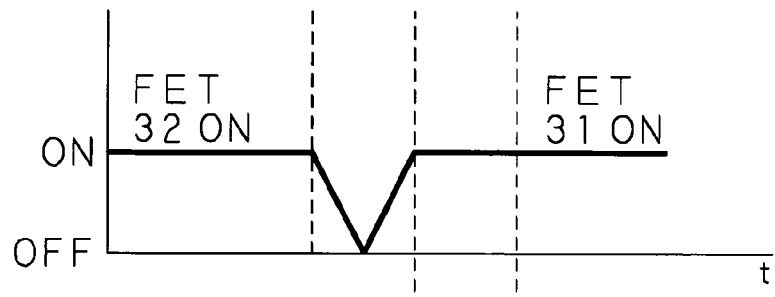
Figure 6C:
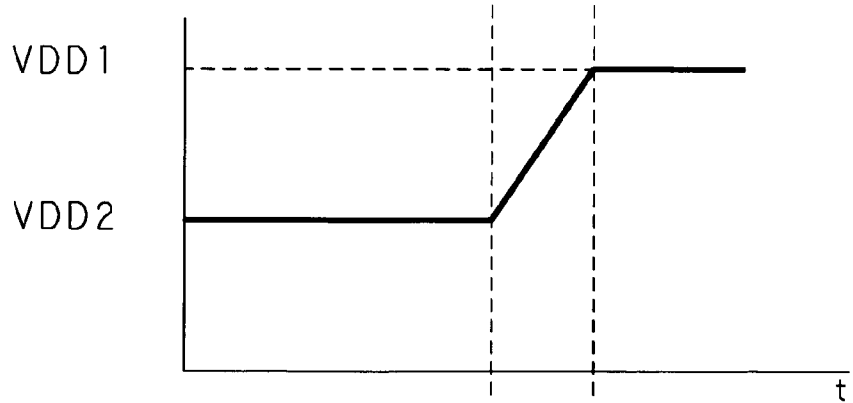
Figure 6D:
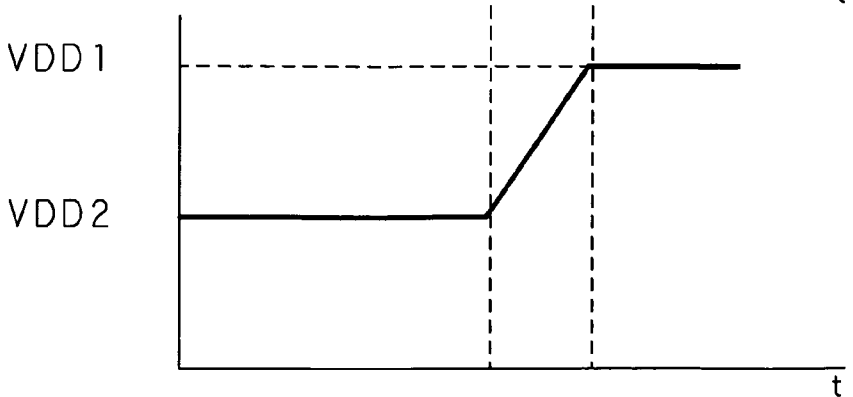

Next, the operation of the above-mentioned buffer circuit 2 according to the present invention will be described below. FIG. 6A, FIG. 6B, FIG. 6C and FIG. 6D are time charts showing operation states of the buffer circuit 2 at the time of power-ON. FIG. 6A shows the changes in the voltages of the two power sources VD1 and VD2, FIG. 6B shows the ON/OFF states of the two FETs 31 and 32 of the power source switching circuit 3, FIG. 6C shows the state at the connection node of the power source switching circuit 3 and the inverter circuit 4, more specifically, the state of the voltage Vb at the connection node of the drain of the FET 31 of the power source switching circuit 3 and the source of the FET 41 of the inverter circuit 4, and FIG. 6D shows the state of the voltage Va at the input terminal of the inverter circuit 5.

As shown in FIG. 6A, in the case that the power source VD1 is turned ON while the power source VD2 (voltage VDD2) is supplied to the buffer circuit 2, the rising of the voltage of the power source VD1 takes time, therefore there is a period in which the voltage of the power source VD1 is lower than the voltage of the power source VD2. In this period, since the voltage of the power source VD1 is lower than the voltage of the power source VD2, the FET 32 turns ON and the FET 31 turns OFF as shown in FIG. 6B. Hence, the voltage Vb at the source of the FET 41 becomes equal to the voltage VDD2 of the power source VD2 as shown in FIG. 6C.

In this case, for example, when the voltage at the input terminal of the inverter circuit 4 is 0V, the FET 41 is in the ON state, and the voltage at the output terminal of the inverter circuit 4 becomes equal to the voltage VDD2 of the power source VD2. Hence, the voltage Va at the input terminal of the inverter circuit 5 also becomes equal to the voltage VDD2 as shown in FIG. 6D.

When the voltage of the power source VD1 rises with the passage of time and reaches a voltage lower than the voltage VDD2 of the power source VD2 by the threshold voltage Vth of the FET 32 at time t1 as shown in FIG. 6A, the FET 32 turns from ON to OFF as shown in FIG. 6B. Furthermore, when the voltage of the power source VD1 reaches a voltage higher than the voltage VDD2 of the power source VD2 by the threshold voltage Vth of the FET 31 at time t2, the FET 31 turns from OFF to ON as shown in FIG. 6B. Since the FET 31 turns ON at this time, the voltage of the power source VD1 is applied to the source of the FET 41 via the source and drain of the FET 31. Hence, the voltage Vb at the source of the FET 41 rises gradually and reaches the voltage VDD1 at time t3 as shown in FIG. 6C. It is assumed that the voltage Vb at time t2 when the FET 31 turns from OFF to ON is VDD2 for the sake of simplicity.

The voltage Va at the input terminal of the inverter circuit 5 changes in a manner similar to the voltage Vb at the source of the FET 41 by virtue of the above-mentioned operation as shown in FIG. 6D. Hence, even in the period in which the voltage of the power source VD1 is lower than the voltage of the power source VD2, the gate voltage of the FET 51 of the inverter circuit 5 can be prevented from becoming lower than the source voltage (VDD2). As a result, since the FET 51 does not turn ON, it is thus possible to suppress the generation of through current flowing the FETs 51 and 52.

Furthermore, even in the case that the power source VD1 is turned OFF and the voltage of the power source VD1 becomes 0V, the power source VD2 is connected to the inverter circuit 4 by the power source switching circuit 3. Hence, the inverter circuit 4 can output a signal to the inverter circuit 5 in accordance with a signal inputted to the inverter circuit 4 itself.

In the case that the voltage of the power source VD1 becomes lower than the voltage of the power source VD2, the source voltage Vb of the FET 41 becomes equal to the voltage of the power source VD2. Hence, the voltage at the source of the FET 33 connected to the source of the FET 41 also becomes equal to the voltage of the power source VD2. On the other hand, since the gate of the FET 33 is connected to the power source VD2, the gate voltage and the source voltage of the FET 33 become equal, and the FET 33 turns OFF. Since the drain of the FET 33 is connected to the back gates of the FETs 31, 32, 33 and 41, the back gate voltages of the FETs 31, 32, 33 and 41 become almost equal to the voltage of the power source VD2 by virtue of the PN forward bias from the source of the FET 33, whereby the circuit can be operated stably.

Furthermore, in the case that the voltage of the power source VD1 is higher than the voltage of the power source VD2, the source voltage Vb of the FET 41 becomes equal to the voltage of the power source VD1, and the source voltage of the FET 33 connected to the source of the FET 41 also becomes equal to the voltage of the power source VD1. On the other hand, since the gate of the FET 33 is connected to the power source VD2, the FET 33 turns ON. Since the drain of the FET 33 is connected to the back gates of the FETs 31, 32, 33 and 41, the back gate voltages of the FETs 31, 32, 33 and 41 become equal to the voltage of the power source VD1, whereby the circuit can be operated stably.

Figure 7A:
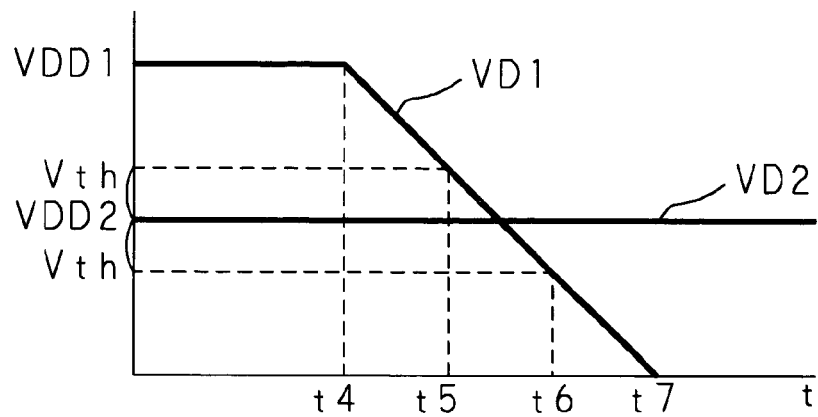
FIG. 7A, FIG. 7B, FIG. 7C and FIG. 7D are time charts showing operation states of the buffer circuit according to the present invention at the time of power-OFF.
Figure 7B:
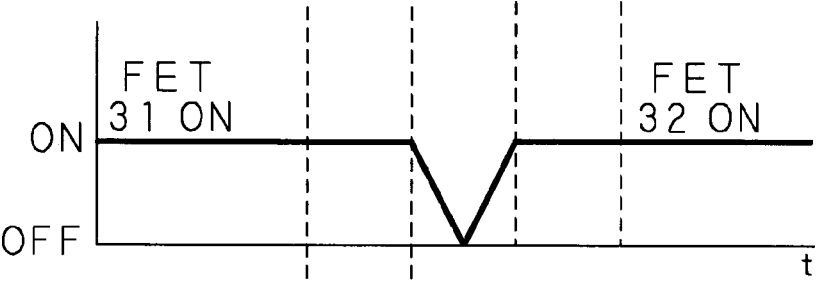
Figure 7C:
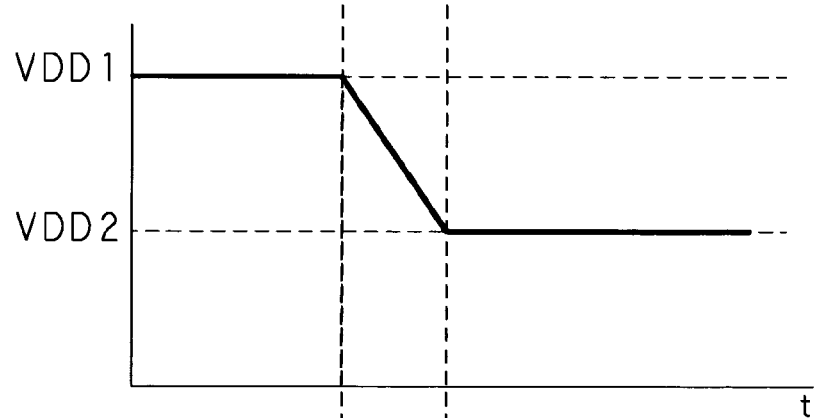
Figure 7D:
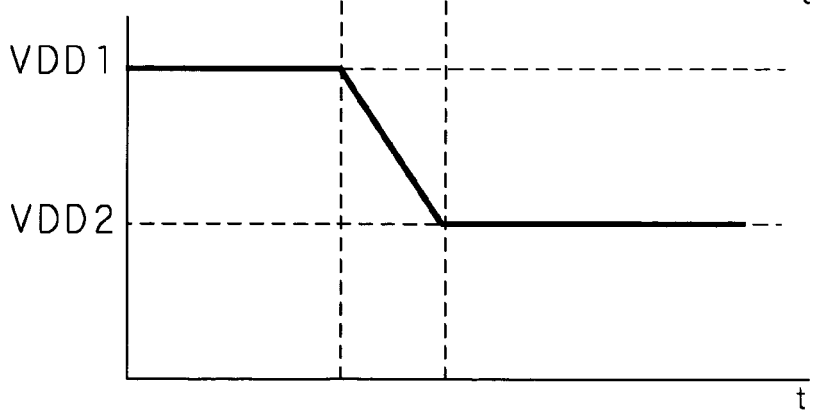

FIG. 7A, FIG. 7B, FIG. 7C and FIG. 7D are time charts showing operation states of the buffer circuit 2 at the time of power-OFF. FIG. 7A shows the changes in the voltages of the two power sources VD1 and VD2, FIG. 7B shows the ON/OFF states of the FETs 31 and 32 of the power source switching circuit 3, FIG. 7C shows the state at the connection node of the power source switching circuit 3 and the inverter circuit 4, more specifically, the state of the voltage Vb at the connection node of the drain of the FET 31 of the power source switching circuit 3 and the source of the FET 41 of the inverter circuit 4, and FIG. 7D shows the state of the voltage Va at the input terminal of the inverter circuit 5.

As shown in FIG. 7A, in the case that the power source VD1 is turned OFF while the power source VD2 (voltage VDD2) is supplied to the buffer circuit 2, the lowering of the voltage of the power source VD1 takes time, therefore there is a transient period in which the voltage of the power source VD1 is higher than the voltage of the power source VD2. However, the voltage of the power source VD1 eventually becomes lower than the voltage of the power source VD2. In the case that the voltage of the power source VD1 becomes lower than the voltage of the power source VD2, the FET 32 turns ON and the FET 31 turns OFF. Hence, the source voltage Vb of the FET 41 becomes equal to the voltage VDD2 of the power source VD2.

In this case, for example, when the voltage at the input terminal of the inverter circuit 4 is 0V, the FET 41 is in the ON state. Hence, the voltage at the output terminal of the inverter circuit 4 becomes equal to the voltage VDD2 of the power source VD2, and the voltage Va at the input terminal of the inverter circuit 5 also becomes equal to the voltage VDD2.

In the transient period in which the voltage of the power source VD1 is higher than the voltage of the power source VD2, when the voltage of the power source VD1 reaches the voltage higher than the voltage VDD2 of the power source VD2 by the threshold voltage Vth of the FET 31 at time t5 after the power source VD1 is turned OFF at time t4 as shown in FIG. 7A, the FET 31 turns from ON to OFF as shown in FIG. 7B. Furthermore, when the voltage of the power source VD1 reaches the voltage lower than the voltage VDD2 of the power source VD2 by the threshold voltage Vth of the FET 32 at time t6, the FET 32 turns from OFF to ON. Since the FET 32 turns ON, the voltage of the power source VD2 is applied to the source of the FET 41 via the source and drain of the FET 32. Hence, the source voltage Vb of the FET 41 is fixed at the voltage of the power source VD2 as shown in FIG. 7C.

Consequently, the voltage Va at the input terminal of the inverter circuit 5 changes in a manner similar to the source voltage Vb of the FET 41 as shown in FIG. 7D. Hence, even in the period in which the voltage of the power source VD1 is lower than the voltage of the power source VD2, the gate voltage of the FET 51 of the inverter circuit 5 can be prevented from becoming lower than the source voltage (VDD2). As a result, the FET 51 does not turn ON, and it is thus possible to suppress the generation of thorough current flowing the FETs 51 and 52.

Figure 8A:
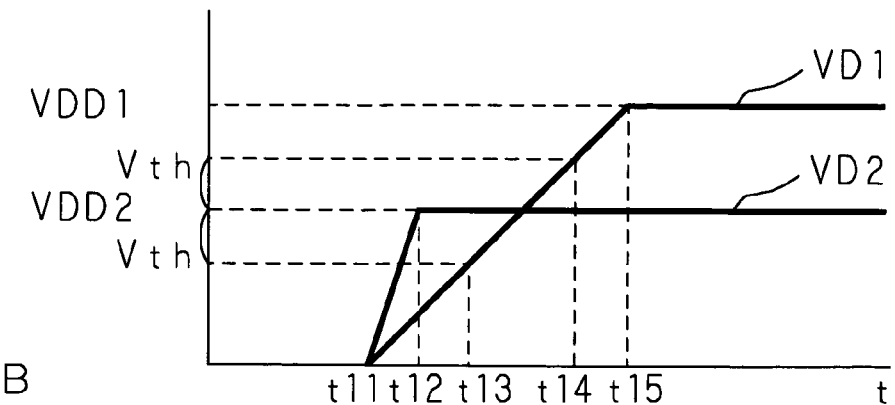
Figure 8B:
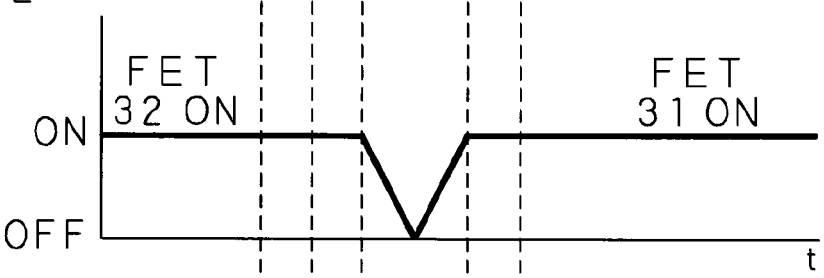
Figure 8C:
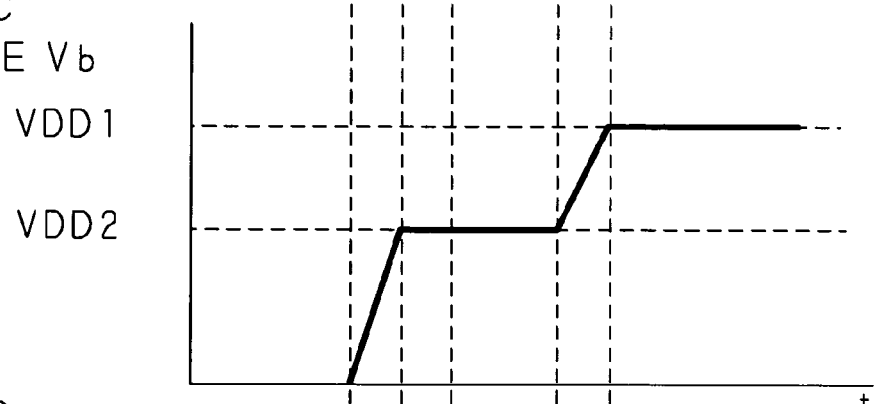
Figure 8D:
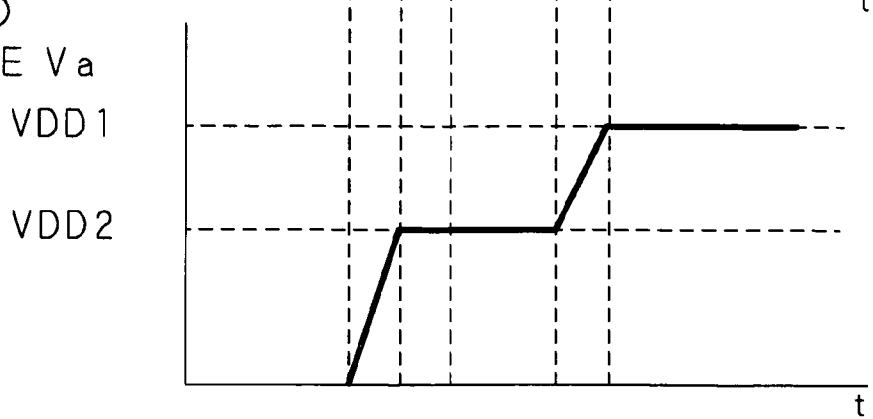

FIG. 8A, FIG. 8B, FIG. 8C and FIG. 8D are time charts showing other operation states of the buffer circuit 2 at the time of power-ON. FIG. 8A shows the changes in the voltages of the two power sources VD1 and VD2, FIG. 8B shows the ON/OFF states of the FETs 31 and 32 of the power source switching circuit 3, FIG. 8C shows the state at the connection node of the power source switching circuit 3 and the inverter circuit 4, more specifically, the state of the voltage Vb at the connection node of the drain of the FET 31 of the power source switching circuit 3 and the source of the FET 41 of the inverter circuit 4, and FIG. 8D shows the state of the voltage Va at the input terminal of the inverter circuit 5.

As shown in FIG. 8A, in the case that the power source VD1 (voltage VDD1) and the power source VD2 (voltage VDD2) are turned on simultaneously at time t11, since the rising of the voltage of the power source VD2 is faster than the rising of the voltage of the power source VD1, there is a transient period in which the voltage of the power source VD1 is lower than the voltage of the power source VD2. However, the voltage of the power source VD1 eventually becomes higher than the voltage of the power source VD2. On the other hand, in the transient period in which the voltage of the power source VD1 is lower than the voltage of the power source VD2, the FET 32 turns ON and the FET 31 turns OFF. Hence, the source voltage Vb of the FET 41 becomes equal to the voltage VDD2 of the power source VD2.

In this case, for example, when the voltage at the input terminal of the inverter circuit 4 is 0V, the FET 41 is in the ON state. Hence, the voltage at the output terminal of the inverter circuit 4 becomes equal to the voltage VDD2 of the power source VD2, and the voltage Va at the input terminal of the inverter circuit 5 also becomes equal to the voltage VDD2.

When the voltage of the power source VD2 reaches VDD2 at time t12 as shown in FIG. 8A, since the FET 32 is in the ON state as shown in FIG. 8B, the source voltage Vb of the FET 41 and the voltage Va at the input terminal of the inverter circuit 5 become the voltage VDD2 of the power source VD2. Next, when the voltage of the power source VD1 reaches the voltage lower than the voltage VDD2 of the power source VD2 by the threshold voltage Vth of the FET 32 at time t13, the FET 32 turns from ON to OFF as shown in FIG. 8B. Furthermore, when the voltage of the power source VD1 reaches the voltage higher than the voltage VDD2 of the power source VD2 by the threshold voltage Vth of the FET 31 at time t14 as shown in FIG. 8A, the FET 31 turns from OFF to ON as shown in FIG. 8B. Since the FET 31 turns ON, the voltage of the power source VD1 is applied to the source of the FET 41 via the source and drain of the FET 31. Hence, the source voltage Vb of the FET 41 rises depending on the voltage of the power source VD1 and reaches the voltage VDD1 at time t15 as shown in FIG. 8C.

Consequently, the voltage Va at the input terminal of the inverter circuit 5 changes in a manner similar to the voltage Vb at the source of the FET 41 as shown in FIG. 8D. Hence, even in the period in which the voltage of the power source VD1 is lower than the voltage of the power source VD2, the gate voltage of the FET 51 of the inverter circuit 5 can be prevented from becoming lower than the source voltage (VDD2). As a result, the FET 51 does not turn ON, and it is thus possible to suppress the generation of through current flowing the FETs 51 and 52.

Figure 9A:
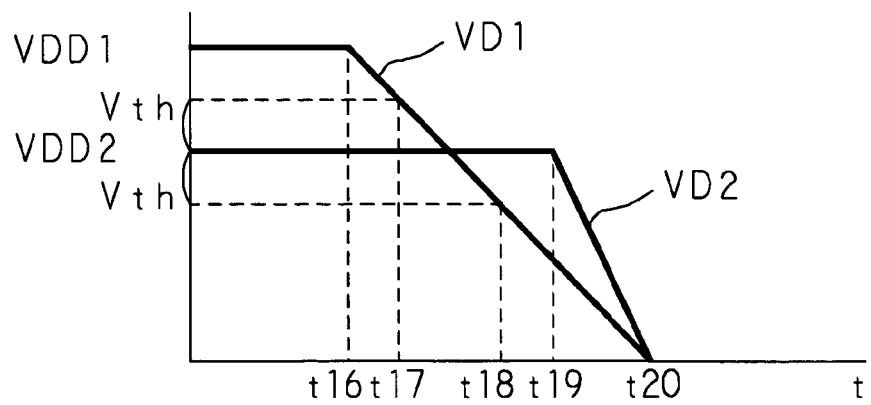
FIG. 9A, FIG. 9B, FIG. 9C and FIG. 9D are time charts showing other operation states of the buffer circuit according to the present invention at the time of power-OFF.
Figure 9B:
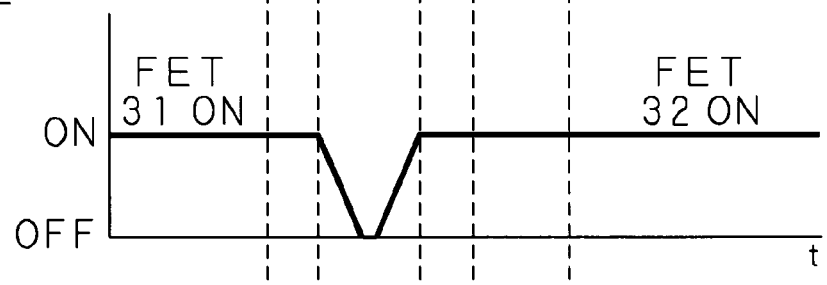
Figure 9C:
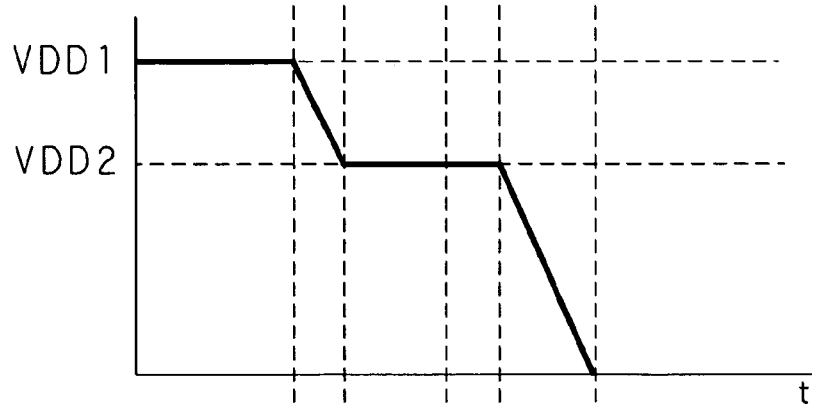
Figure 9D:
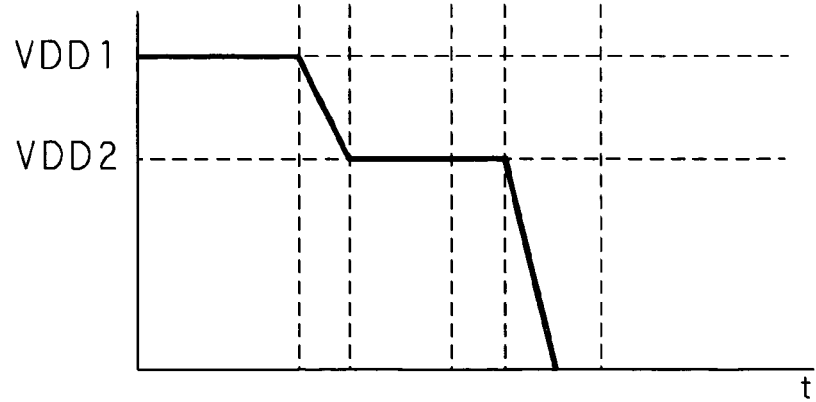

FIG. 9A, FIG. 9B, FIG. 9C and FIG. 9D are time charts showing other operation states of the buffer circuit 2 at the time of power-OFF. FIG. 9A shows the changes in the voltages of the two power sources VD1 and VD2, FIG. 9B shows the ON/OFF states of the FETs 31 and 32 of the power source switching circuit 3, FIG. 9C shows the state at the connection node of the power source switching circuit 3 and the inverter circuit 4, more specifically, the state of the voltage Vb at the connection node of the drain of the FET 31 of the power source switching circuit 3 and the source of the FET 41 of the inverter circuit 4, and FIG. 9D shows the state of the voltage Va at the input terminal of the inverter circuit 5.

In the case that the power source VD1 (voltage VDD1) is turned OFF at time t16 and when the power source VD2 (voltage VDD2) is turned OFF at time t19 as shown in FIG. 9A, the voltage of the power source VD1 begins to lower earlier. Hence, there is a transient period in which the voltage of the power source VD1 is lower than the voltage of the power source VD2. However, both the voltage of the power source VD1 and the voltage of the power source VD2 become 0V eventually. On the other hand, in the transient period in which the voltage of the power source VD1 is lower than the voltage of the power source VD2, the FET 32 turns ON and the FET 31 turns OFF. Hence, the source voltage Vb of the FET 41 becomes equal to the voltage VDD2 of the power source VD2.

In this case, for example, when the voltage at the input terminal of the inverter circuit 4 is 0V, the FET 41 is in the ON state. Hence, the voltage at the output terminal of the inverter circuit 4 becomes equal to the voltage VDD2 of the power source VD2, and the voltage Va at the input terminal of the inverter circuit 5 also becomes equal to the voltage VDD2.

When the voltage of the power source VD1 reaches the voltage higher than the voltage VDD2 of the power source VD2 by the threshold voltage Vth of the FET 31 at time t17 after the power source VD1 is turned OFF at time t16 as shown in FIG. 9A, the FET 31 turns from ON to OFF as shown in FIG. 9B. Furthermore, when the voltage of the power source VD1 reaches the voltage lower than the voltage VDD2 of the power source VD2 by the threshold voltage Vth of the FET 32 at time t18 as shown in FIG. 9A, the FET 32 turns from OFF to ON as shown in FIG. 9B. Since the FET 32 turns ON, the voltage of the power source VD2 is applied to the source of the FET 41 via the source and drain of the FET 32. Hence, the source voltage Vb of the FET 41 changes depending on the voltage of the power source VD2 as shown in FIG. 9C.

Consequently, the voltage Va at the input terminal of the inverter circuit 5 changes in a manner similar to the voltage Vb at the source of the FET 41 as shown in FIG. 9D. Hence, even in the period in which the voltage of the power source VD1 is lower than the voltage of the power source VD2, the gate voltage of the FET 51 of the inverter circuit 5 can be prevented from becoming lower than the source voltage (VDD2). As a result, the FET 51 does not turn ON, and it is thus possible to suppress the generation of through current flowing the FETs 51 and 52.

As described above, in the buffer circuit 2 equipped with the power sources (VD1 and VD2) having different voltages according to the present invention, in the case that the power sources VD1 and VD2 are turned ON or OFF, switching is carried out between the power sources VD1 and VD2 depending on the high or low of the voltage between the power source VD1 and the power source VD2, whereby the voltage at the input terminal of the inverter circuit 5 is prevented from becoming lower than the voltage of the power source VD2. With this configuration, through current flows the inverter circuit 5 is prevented, whereby the power consumption of the buffer circuit can be made lower than that of this kind of conventional circuit. Furthermore, even in the case that the power source VD1 is turned OFF, the voltage of the power source VD2 is applied to the first logical gate circuit, whereby the function of the inverter circuit 4 does not stop. Hence, even in this case, a signal inputted to the inverter circuit 4 can be outputted to the inverter circuit 5, and signal transmission can thus be carried out inside the integrated circuit 1.

Embodiment 2

Figure 10:
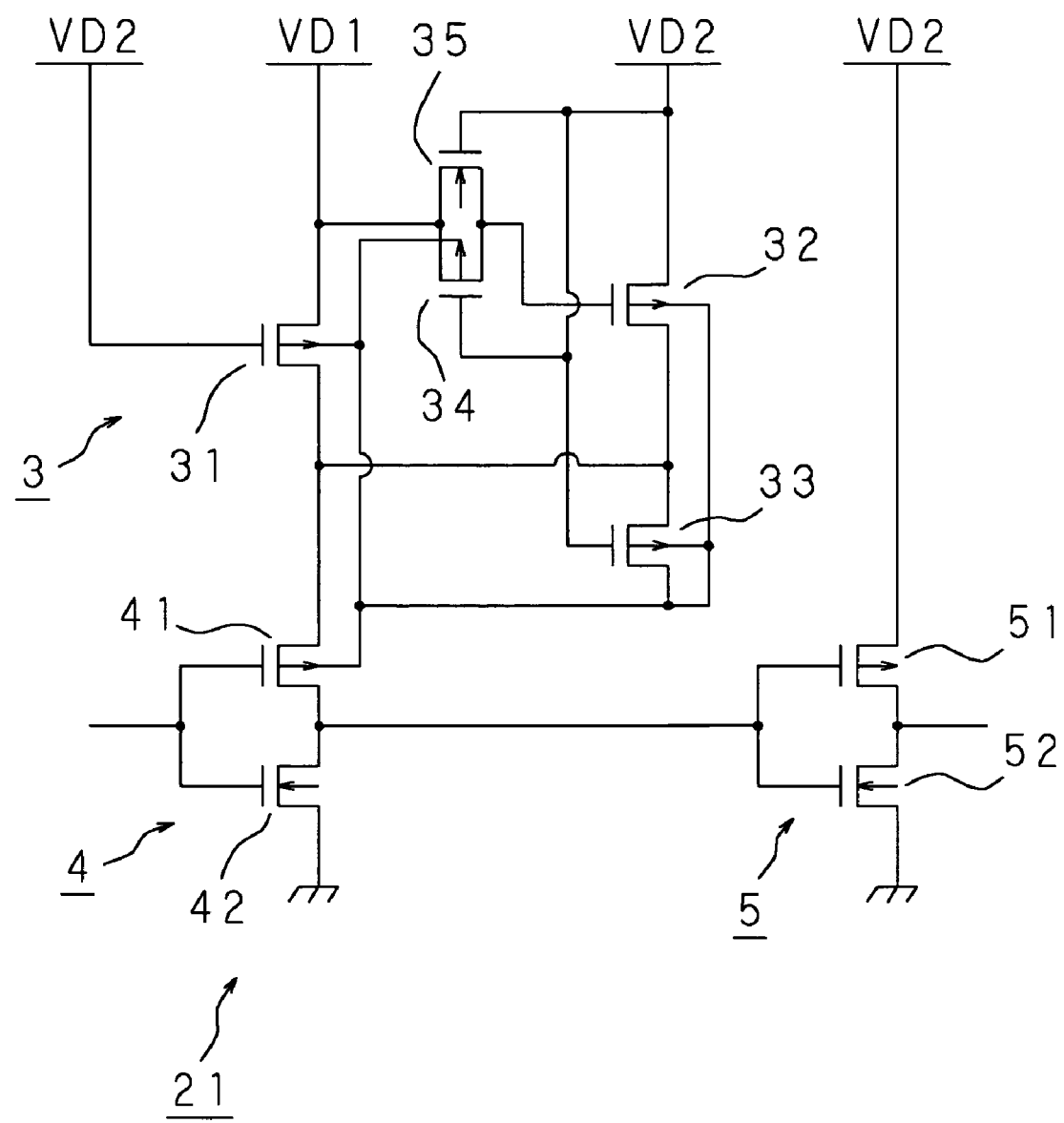
FIG. 10 is a circuit diagram showing the specific circuit configuration of a buffer circuit according to Embodiment 2 of the present invention.

FIG. 10 is a circuit diagram showing the specific circuit configuration of a buffer circuit according to Embodiment 2 of the present invention. A buffer circuit 21 according to Embodiment 2 is equipped with a transmission gate which is composed of a P-channel FET 34 and an N-channel FET 35 and is inserted between the power source VD1 and the gate of the FET 32 of a power source switching circuit 3, in addition to the buffer circuit according to Embodiment 1.

A source of the FET 34 is connected to a source of the FET 35 and also connected to the power source VD1. A gate of the FET 34 is connected to a gate of the FET 34 and also connected to the power source VD2 and the gate of the FET 33. A drain of the FET 34 is connected to a drain of the FET 35 and also connected to the gate of the FET 32. A back gate of the FET 34 is connected to the back gates of the FETs 31, 32, 33 and 41. Other components similar to those of Embodiment 1 are designated by the same numerals and their descriptions are omitted.

Next, the operation of the buffer circuit 21 according to Embodiment 2 will be described referring to the above-mentioned time charts in FIG. 6 to FIG. 9. The FET 35 constituting the transmission gate becomes saturation at about time t1 to time t2 shown in FIG. 6A, at about time t5 to time t6 shown in FIG. 7A, at about time t13 to time t14 shown in FIG. 8A and at about time t17 to time t18 shown in FIG. 9A. As a result, the gate voltage of the FET 32 becomes the voltage obtained by subtracting the threshold voltage of the FET 35 from the voltage of the power source VD2, and the voltage lower than the voltage of the power source VD2 is applied to the gate of the FET 32. Hence, in comparison with the case wherein the voltage of the power source VD2 is applied to the gate of the FET 32, time t1 in FIG. 6A and time t13 in FIG. 8A can be delayed, and time t6 in FIG. 7A and time t18 in FIG. 9A can be advanced.

Furthermore, since the FET 34 and the FET 31 carry out the same operation, for example, in the case that the voltage of the power source VD1 becomes higher than the voltage of the power source VD2, the FET 34 turns ON at the same time when the FET 31 turns ON. Hence, the gate voltage of the FET 32 becomes equal to the voltage of the power source VD1, and the FET 32 turns OFF.

As described above, in Embodiment 2, the transmission gate which is composed of the FETs 34 and 35 is inserted between the power source VD1 and the gate of the FET 32, whereby the time required for power source switching can be shortened in comparison with the case wherein the voltage of the power source VD2 is applied to the gate of the FET 32.

Embodiment 3

Figure 11:
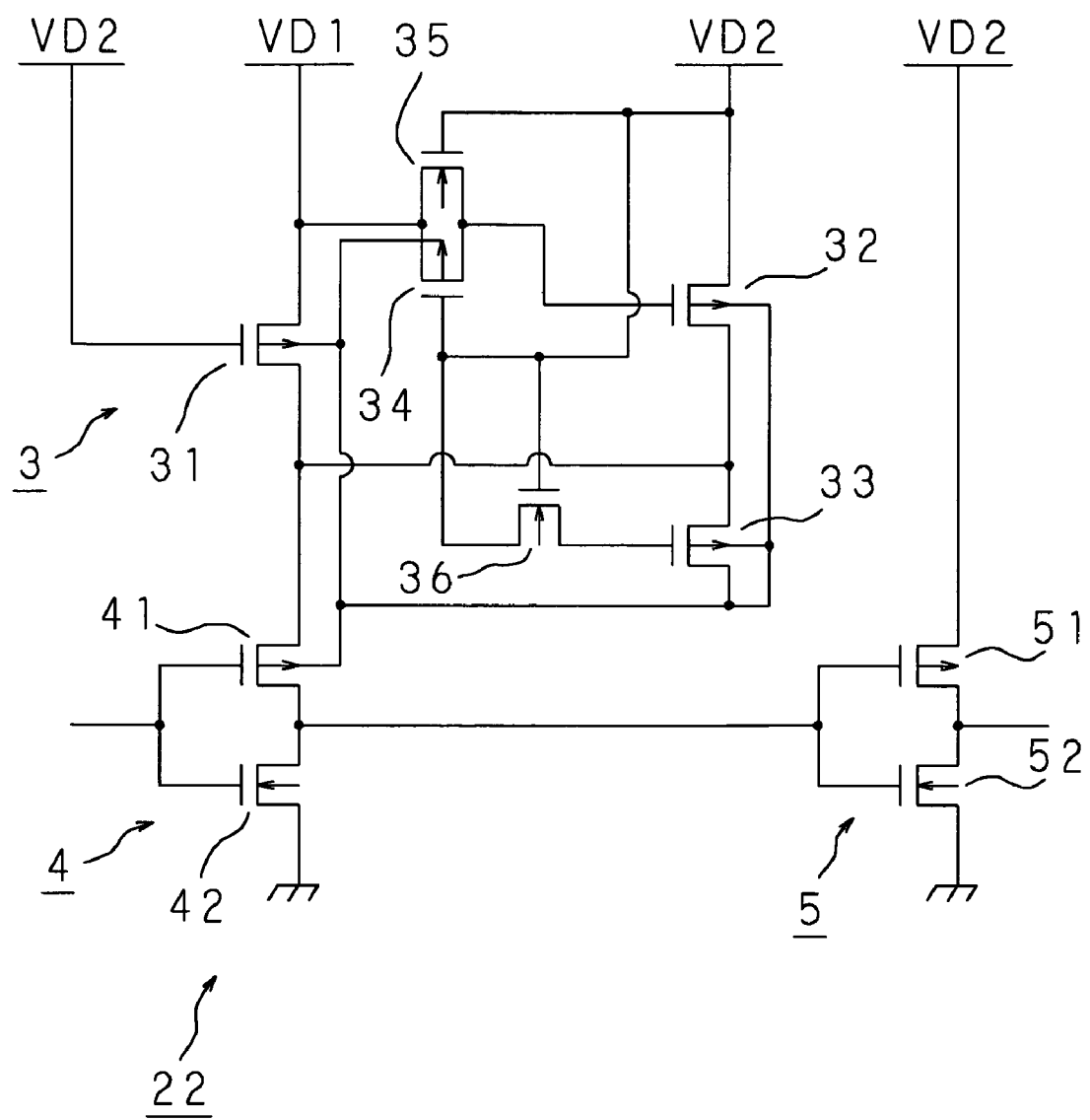
FIG. 11 is a circuit diagram showing the specific circuit configuration of a buffer circuit according to Embodiment 3 of the present invention.

FIG. 11 is a circuit diagram showing the specific circuit configuration of a buffer circuit according to Embodiment 3 of the present invention. A buffer circuit 22 according to Embodiment 3 is equipped with an N-channel FET 36 connected between the power source VD2 and the gate of the FET 33 of a power source switching circuit 3, in addition to the buffer circuit according to Embodiment 2.

A gate and a drain of the FET 36 are connected to the power source VD2. A source of the FET 36 is connected to the gate of the FET 33. Other components similar to those of Embodiment 2 are designated by the same numerals and their descriptions are omitted.

Next, the operation of the buffer circuit 22 according to Embodiment 3 will be described. In the case that the voltage of the power source VD1 becomes lower than the voltage of the power source VD2 when the power sources VD1 and VD2 are turned ON or OFF, the P-channel FET 34 turns OFF since its gate voltage becomes higher than its source voltage. The N-channel FET 35 turns ON since its gate voltage becomes higher than its source voltage. In addition, the FET 31 turns OFF since its gate voltage becomes higher than its source voltage. Furthermore, the FET 32 turns ON since its gate voltage becomes lower than its source voltage.

Since the gate voltage and the source voltage of the FET 36 are equal to the voltage of the power source VD2, the FET 36 becomes saturation. Hence, the gate voltage of the FET 33 becomes the voltage obtained by subtracting the threshold voltage of the FET 36 from the voltage of the power source VD2, and the voltage lower than the voltage of the power source VD2 is applied to the gate of the FET 33. As a result, in comparison with the case wherein the voltage of the power source VD2 is applied to the gate of the FET 33, the ON operation of the FET 33 can be hastened.

When the voltage of the power source VD1 is higher than the voltage of the power source VD2, the source voltage Vb of the FET 41 becomes equal to the voltage of the power source VD1. Hence, the source voltage of the FET 33 connected to the source of the FET 41 also becomes equal to the voltage of the power source VD1. On the other hand, since the voltage almost equal to the voltage of the power source VD2 is applied to the gate of the FET 33 via the FET 36, the FET 33 turns ON. Since the drain of the FET 33 is connected to the back gates of the FETs 31, 32, 33 and 41, the back gate voltages of the FETs 31, 32, 33 and 41 become equal to the voltage of the power source VD1, whereby the circuit can be operated stably.

As described above, the ON operation of the FET 33 can be hastened by connecting the FET 36 to the gate of the FET 33. Hence, the time required for making the back gate voltages of the FETs 31, 32, 33 and 41 equal to the voltage of the power source VD1 is shortened. As a result, the circuit operation can be stabilized in a short time.

The configuration using the inverter circuits 4 and 5, wherein a P-channel FET and an N-channel FET are connected in series as an example of a logical gate circuit, has been described in the above-mentioned Embodiments 1, 2 and 3. However, the configuration of the logical gate circuit is not required to be limited to this kind of circuit. Other logical gate circuits, such as NAND and NOR, may also be used, provided that an inverter circuit is included.

Furthermore, the configuration example wherein the voltages of the power sources VD1 and VD2 are positive voltages with respect to the ground level has been described in the above-mentioned Embodiments 1, 2 and 3. However, the configuration is not required to be limited to such a configuration. A configuration wherein the voltages of the power sources VD1 and VD2 are negative voltages with respect to the ground level may also be used. In this kind of configuration, the power source switching circuit 3 detects the absolute voltage values of the power sources VD1 and VD2 and can thus carry out power source switching depending on the high or low between the detected absolute voltage values.

As this invention may be embodied in several forms without departing from the spirit of essential characteristics thereof, the present embodiment are therefore illustrative and not restrictive, since the scope of the invention is defined by the appended claims rather than by the description preceding them, and all changes that fall within metes and bounds of the claims, or equivalence of such metes and bounds there-of are therefore intended to be embraced by the claims.

The invention claimed is:

1. A buffer circuit comprising:
a first power source;
a second power source different from said first power source;
a first logical gate circuit powered by said first power source through a power source switching circuit and including a CMOS inverter circuit;
a second logical gate circuit powered by said second power source and whose input terminal is connected to an output terminal of said first logical gate circuit; and
the power source switching circuit for, at a time of power-ON of the first power source, at a time of power-OFF of the first power source and at a duration therebetween, switching the power source for said first logical gate circuit from said first power source to said second power source while the voltage of said first power source is lower than the voltage of said second power source, and to said first power source when the voltage of said first power source becomes higher than the voltage of said second power source.

2. The buffer circuit as set forth in claim 1, wherein said power source switching circuit comprises a first switching element for supplying the voltage of said first power source to said first logical gate circuit and a second switching element for supplying the voltage of said second power source to said first logical gate circuit, and turns ON or OFF said first switching element or said second switching element depending on high or low of the voltage of said first power source and said second power source.

3. The buffer circuit as set forth in claim 2, wherein said CMOS inverter circuit includes a first FET of a P-channel FET, and a second FET of an N-channel FET whose drain and gate are connected to a drain and a gate of said first FET, respectively;
said first switching element is a third FET of a P-channel FET whose source is connected to said first power source and whose gate is connected to said second power source;
said second switching element is a fourth FET of a P-channel FET whose source is connected to said second power source, whose gate is connected to said first power source and whose drain is connected to a drain of said third FET; and
the drain of said fourth FET is connected to a source of said first FET of said first logical gate circuit.

4. The buffer circuit as set forth in claim 3, further comprising a seventh FET of a P-channel FET whose source is connected to the respective drains of said third FET and said fourth FET and whose gate is connected to said second power source,
wherein a drain and a back gate of said seventh FET are connected to back gates of said first, third, and fourth FETs.

5. The buffer circuit as set forth in claim 3, further comprising:
a seventh FET of a P-channel FET whose source is connected to the respective drains of said third FET and said fourth FET; and
an eighth FET of an N-channel FET whose gate and drain are connected to said second power source and whose source is connected to a gate of said seventh FET;
wherein a drain and a back gate of said seventh FET are connected to back gates of said first, third, and fourth FETs.

6. The buffer circuit as set forth in claim 2, wherein said CMOS inverter circuit including a first FET of a P-channel FET, and a second FET of an N-channel FET whose source and gate are connected to a drain and a gate of said first FET, respectively; said first switching element is a third FET of a P-channel FET whose source is connected to said first power source and whose gate is connected to said second power source; and said second switching element is a fourth FET of a P-channel FET whose source is connected to said second power source and whose drain is connected to the source of said first FET of said first logical gate circuit and a drain of said third FET; said buffer circuit further comprising a fifth FET of a P-channel FET and a sixth FET of an N-channel FET whose respective sources are connected to each other and also connected to said first power source, whose respective drains are connected to each other and also connected to a gate of said fourth FET and whose respective gates are connected to each other and also connected to said second power source.

7. The buffer circuit as set forth in claim 6, further comprising a seventh FET of a P-channel FET whose source is connected to the respective drains of said third FET and said fourth FET and whose gate is connected to said second power source, wherein a drain and a back gate of said seventh FET are connected to back gates of said first, third, fourth and fifth FETs.

8. The buffer circuit as set forth in claim 6, further comprising: a seventh FET of a P-channel FET whose source is connected to the respective drains of said third FET and said fourth FET; and an eighth FET of an N-channel FET whose gate and drain are connected to said second power source and whose source is connected to a gate of said seventh FET; wherein a drain and a back gate of said seventh FET are connected to back gates of said first, third, fourth and fifth FETs.

9. An integrated circuit comprising:
a buffer circuit including:
a first power source;
a second power source different from said first power source;
a first logical gate circuit powered by said first power source through a power source switching circuit and including a CMOS inverter circuit;
a second logical gate circuit powered by said second power source and whose input terminal is connected to an output terminal of said first logical gate circuit; and
a power source switching circuit for, at a time of power-ON of the first power source, at a time of power-OFF of the first power source and at a duration therebetween, switching the power source for said first logical gate circuit from said first power source to said second power source while the voltage of said first power source is lower than the voltage of said second power source, and to said first power source when the voltage of said first power source becomes higher than the voltage of said second power source.

10. The integrated circuit as set forth in claim 9, wherein said power source switching circuit comprises a first switching element for supplying the voltage of said first power source to said first logical gate circuit and a second switching element for supplying the voltage of said second power source to said first logical gate circuit, and turns ON or OFF said first switching element or said second switching element depending on high or low of the voltage of said first power source and said second power source.

11. The integrated circuit as set forth in claim 10, wherein
said CMOS inverter circuit includes a first FET of a P-channel FET, and a second FET of an N-channel FET whose drain and gate are connected to a drain and a gate of said first FET, respectively;
said first switching element is a third FET of a P-channel FET whose source is connected to said first power source and whose gate is connected to said second power source;
said second switching element is a fourth FET of a P-channel FET whose source is connected to said second power source, whose gate is connected to said first power source and whose drain is connected to a drain of said third FET; and
the drain of said fourth FET is connected to a source of said first FET of said first logical gate circuit.

12. The integrated circuit as set forth in claim 11, wherein said buffer circuit further including a seventh FET of a P-channel FET whose source is connected to the respective drains of said third FET and said fourth FET and whose gate is connected to said second power source,
wherein a drain and a back gate of said seventh FET are connected to back gates of said first, third, and fourth FETs.

13. The integrated circuit as set forth in claim 11, wherein said buffer circuit further including:
a seventh FET of a P-channel FET whose source is connected to the respective drains of said third FET and said fourth FET; and
an eighth FET of an N-channel FET whose gate and drain are connected to said second power source and whose source is connected to a gate of said seventh FET;
wherein a drain and a back gate of said seventh FET are connected to back gates of said first, third, and fourth FETs.

14. The integrated circuit as set forth in claim 10, wherein said CMOS inverter circuit including a first FET of a P-channel FET, and a second FET of an N-channel FET whose source and gate are connected to a drain and a gate of said first FET, respectively; said first switching element is a third FET of a P-channel FET whose source is connected to said first power source and whose gate is connected to said second power source; and said second switching element is a fourth FET of a P-channel FET whose source is connected to said second power source and whose drain is connected to the source of said first FET of said first logical gate circuit and a drain of said third FET; said buffer circuit further comprising a fifth FET of a P-channel FET and a sixth FET of an N-channel FET whose respective sources are connected to each other and also connected to said first power source, whose respective drains are connected to each other and also connected to a gate of said fourth FET and whose respective gates are connected to each other and also connected to said second power source.

15. The integrated circuit as set forth in claim 14, wherein said buffer circuit further including a seventh FET of a P-channel FET whose source is connected to the respective drains of said third FET and said fourth FET and whose gate is connected to said second power source, wherein a drain and a back gate of said seventh FET are connected to back gates of said first, third, fourth and fifth FETs.

16. The integrated circuit as set forth in claim 14, wherein said buffer circuit further including: a seventh FET of a P-channel FET whose source is connected to the respective drains of said third FET and said fourth FET; and an eighth FET of an N-channel FET whose gate and drain are connected to said second power source and whose source is connected to a gate of said seventh FET; wherein a drain and a back gate of said seventh FET are connected to back gates of said first, third, fourth and fifth FETs.

* * * * *